(12) United States Patent
Jacunski et al.

(10) Patent No.: US 7,221,601 B2
(45) Date of Patent: May 22, 2007

(54) TIMER LOCKOUT CIRCUIT FOR SYNCHRONOUS APPLICATIONS

(75) Inventors: Mark D. Jacunski, Colchester, VT (US); Alan D. Norris, Hinesburg, VT (US); Samuel K. Weinstein, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/363,678

(22) Filed: Feb. 28, 2006

(65) Prior Publication Data

US 2006/0152994 A1    Jul. 13, 2006

Related U.S. Application Data

(62) Division of application No. 10/604,168, filed on Jun. 29, 2003, now Pat. No. 7,068,564.

(51) Int. Cl.
*G11C 7/00* (2006.01)
*H03H 11/26* (2006.01)

(52) U.S. Cl. .............. 365/191; 365/194; 327/261; 327/276

(58) Field of Classification Search ............ 365/191
See application file for complete search history.

(56) References Cited

U.S. PATENT DOCUMENTS

| | | | |
|---|---|---|---|
| 5,841,707 A * | 11/1998 | Cline et al. ............ | 365/194 |
| 6,353,573 B1 | 3/2002 | Koshikawa | |
| 6,415,402 B2 * | 7/2002 | Bishop et al. .......... | 714/724 |
| 6,434,082 B1 | 8/2002 | Hovis et al. | |
| 6,507,526 B2 | 1/2003 | Ohtake | |
| 6,538,933 B2 * | 3/2003 | Akioka et al. ......... | 365/194 |
| 2003/0185075 A1 | 10/2003 | Park et al. | |
| 2005/0149779 A1* | 7/2005 | Bleakley ................ | 714/700 |

* cited by examiner

*Primary Examiner*—Son L. Mai
(74) *Attorney, Agent, or Firm*—Schmeiser, Olson & Watts; Anthony J. Canale

(57) ABSTRACT

A SDRAM. The SDRAM including: at least one bank of DRAM cells; the SDRAM operable to a first specification defined by a first clock frequency, a first write recovery time and a first time interval for precharge to row address strobe; and means for programming the SDRAM operable to a second specification defined by a second clock frequency, a second write recovery time and a second time interval for precharge to row address strobe.

18 Claims, 4 Drawing Sheets

TIMER LOCKOUT CIRCUIT FOR SYNCHRONOUS APPLICATIONS

This application is a divisional of Ser. No. 10/604,168 filed on Jun. 29, 2003 now U.S. Pat. No. 7,068,564

FIELD OF THE INVENTION

The present invention relates to the field of synchronous circuits; more specifically, it relates to a lockout timer for synchronous circuits and especially for synchronous dynamic random access memory circuits.

BACKGROUND OF THE INVENTION

Generally synchronous circuits, such a synchronous dynamic random access memory (SDRAM) circuits are designed to run at a pre-determined clock speed and with specified minimum fixed timings between critical input/output (I/O) events. It would be cost-effective to design and build synchronous circuits that can run at more than one clock speed as well as meet more than one set of I/O event timing specifications.

SUMMARY OF THE INVENTION

A first aspect of the present invention is a timer lockout circuit comprising: a first delay circuit for receiving and delaying a first timing signal; first circuit for receiving the first timing signal from the first delay circuit and for latching the first timing signal; programmable timing circuit for receiving the first timing signal from the first circuit and for delaying the first timing signal by a programmable time interval; a one-shot generator for receiving the first timing signal from the programmable timing circuit and for generating a set signal; a second circuit for receiving the set signal from the one-shot generator and for latching the set signal; a third circuit for receiving a second timing signal and for latching the second timing signal; a combinational logic circuit for receiving the set signal from the second circuit and for receiving the second timing signal from the third circuit and for generating a third timing signal; and a second delay circuit for receiving and delaying the third timing signal and for simultaneously resetting the first circuit, the second circuit and the third circuit after delaying the third timing signal.

A second aspect of the present invention is a timer lockout circuit comprising: first means for receiving a first timing signal from a first delay circuit and for latching the first timing signal; second means for receiving the first timing signal from the first means and for delaying the first timing signal by a programmable time interval; third means for receiving the first timing signal from the second means and for generating a set signal; fourth means for receiving the set signal from the third means and for latching the set signal; fifth means for receiving a second timing signal and for latching the second timing signal; sixth means for receiving the set signal from the fourth means and for receiving the second timing signal from the fifth means and for generating a third timing signal; and seventh means for simultaneously resetting the first means, the fourth means and the fifth means.

A third aspect of the present invention is a SDRAM comprising: at least one bank of DRAM cells; the SDRAM operable to a first write recovery time; a first circuit for programming the SDRAM operable to a second write recovery time; and a second circuit for delaying the start of a precharge command for a time interval equal to the first write recovery time when the SDRAM is operable to the second write recovery time.

A fourth aspect of the present invention is a SDRAM comprising: at least one bank of DRAM cells; the SDRAM operable to a first write recovery time; a first circuit for programming the SDRAM operable to a second write recovery time; and a second circuit for delaying the start of a precharge command for a time interval equal to the first write recovery time when the SDRAM is operable to the second write recovery time.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

While the present invention will be described using an SDRAM circuit as an example of a synchronous circuit to which the present invention is applicable and while a SDRAM according to the present invention is one aspect of the present invention, certain other aspects of the present invention are applicable to other synchronous circuits such as static RAMs, controllers and microprocessors.

Figure 1:
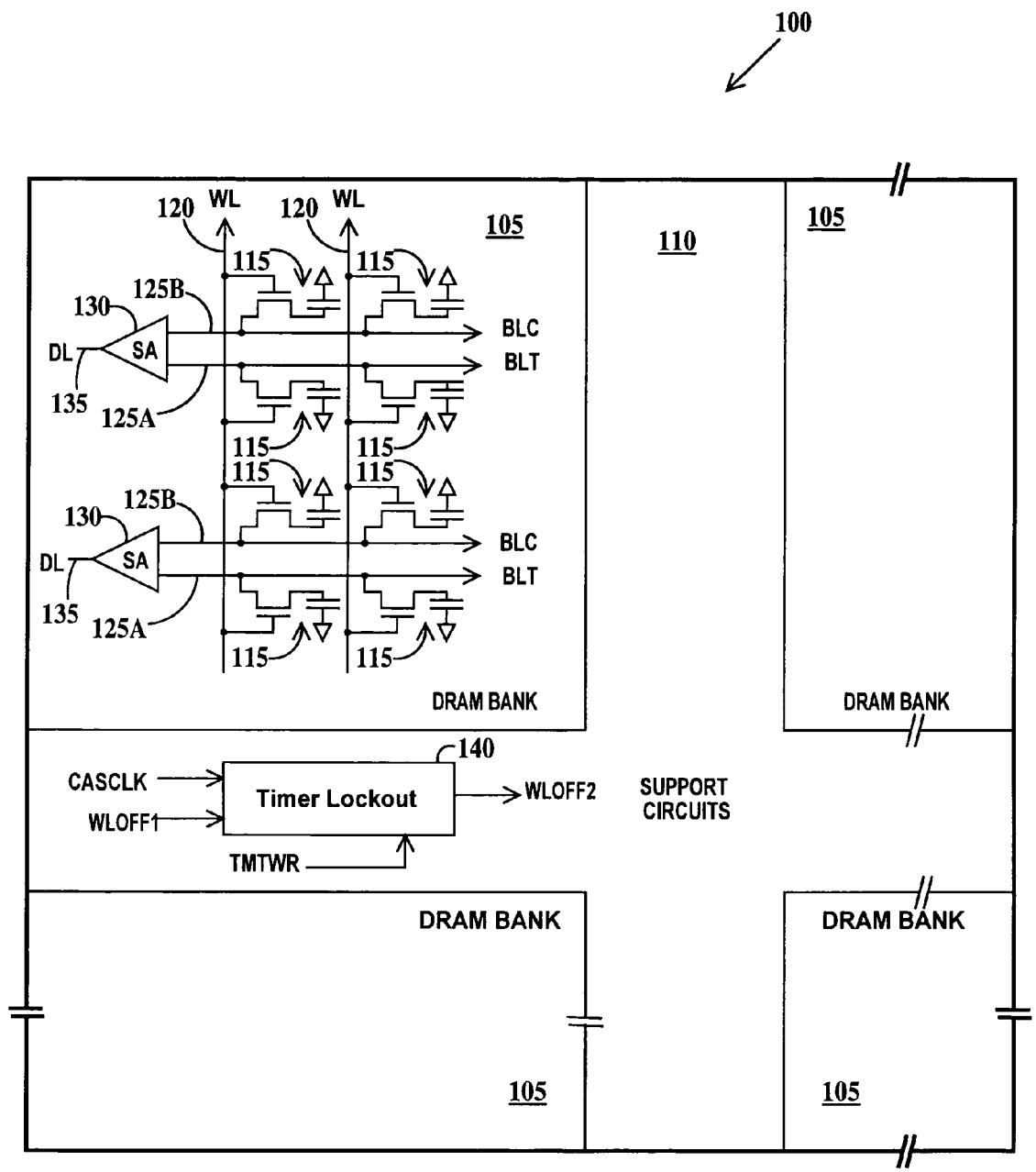
FIG. 1 is a schematic circuit diagram of an SDRAM circuit according to the present invention.

FIG. 1 is a schematic circuit diagram of an SDRAM circuit according to the present invention. In FIG. 1, an SDRAM 100 includes DRAM banks 105 and a support circuit region 110. DRAM banks 105 include a multiplicity of memory cells 115 arranged in rows and columns and accessible through word lines 120 connected to read, write and address circuits in support circuit region 110 and a multiplicity of bit lines true 125A and a multiplicity of bit lines complement 125B also connected to read, write and address circuits in the support region. Each bit line true 125A/bit line complement 125B bit line pair is connected to a sense amplifier 130. The output of sense amplifiers 130 are coupled to data lines 135.

A DRAM is written or read (after a bank is selected) by bringing a selected word line high to move the charge stored in all cells coupled to that wordline to the bit lines. The sense amplifiers amplify this small amount of charge. Bit lines must be precharged after a write prior to a read or the next write cycle. Writing, reading and precharging take finite amounts of time to accomplish. These times are reflected in the DRAM specifications in Table I which are typical examples of such specification.

TABLE I

| Specification | DDR 266 | DDR 333 |
|---|---|---|
| $t_{CK}$ | 7.5 ns | 6.0 ns |
| $t_{WR}$ | 15 ns | 12 ns |
| $t_{RP}$ | 15 ns | 18 ns |

Table I lists two different JEDEC Solid State Technology Association (Washington D.C.) double data rate (DDR) specifications. Table I is meant to be exemplary of the problem solved by the present invention. A DDR specification means data may be written/read on both the rise and fall of a clock pulse. The clock period is $t_{CK}$. The clock frequency of the SDRAM specification is $1/t_{CK}$.

The parameter $t_{WR}$ is defined as the write recovery time, the minimum amount of time that must elapse after a write before a bit line precharge command <PC> may be issued. This timing starts at the first rising clock edge after the last data <D> is coupled to the DRAM I/O pins. Because a <PC> command brings down a word line, $t_{WR}$ determines the minimum internal time $t_{WRT}$, to write a memory cell.

The parameter $t_{RP}$ is defined as the precharge to RAS (row address strobe) time and is the time after a <PC> command which must elapse before a bank activate <BA> command may be issued. Because a <BA> command brings up a word line, $t_{RP}$ determines the minimum internal time $t_{EQL}$, to equalize (precharge) a bitline. The relationship between the <BA> command, the <W> command, the <PC> command, <D>, $t_{WR}$, $t_{RP}$, $t_{WRT}$ and $t_{EQL}$ (as well as a read <R>) command is illustrated in FIG. 2 and described in more detail infra.

While it is straightforward to design a SDRAM that can meet either the DDR 226 or DDR 333 specification separately (i.e. DDR 226: $t_{WR}$=15 ns and $t_{RP}$=15 ns for $t_{WR}$+$t_{RP}$=30 ns or DDR 333: $t_{WR}$=12 ns and $t_{RP}$=18 ns for $t_{WR+tRP}$=30 ns), meeting both specifications outright, requires that the SDRAM satisfy the minimum timing of each specification (i.e. $t_{WR}$=12 ns and $t_{RP}$=15, reducing the total $t_{WR}$+$t_{RP}$=30 ns to 27 ns). The result is that the internal timing, $t_{WRT}$ is also reduced by 3 ns. The purpose of the timer lockout circuit 140 in support circuit region 110 of SDRAM 100 is to allow both specifications to be met without a corresponding reduction in $t_{WRT}$.

Timer lockout circuit 140 utilizes the normal column address strobe clock (CASCLK) and normal wordline off signal (WLOFF1) to produce a new wordline off signal (WLOFF2) which meets both of the timing specifications shown in Table I. WLOFF1 is generated by a precharge <PC> command. Timer lockout circuit 140 maintains internal timings $t_{WRT}$ and $t_{EQL}$ while requiring only that the sum of the minimum $t_{WR}$ specification and the minimum $t_{RP}$ specification remain constant. This is accomplished by the timer lockout circuit delaying the start of <PC> commands by the difference between the two $t_{WR}$ specifications. This has the effect of trading off "extra" $t_{EQL}$ time for $t_{WRT}$ time. In the example of Table I, <the WLOFF2 signal will be issued exactly the same amount of time after the <PC> command (CASCLK) for both DDR 226 and DDR 333 specifications. The result is that the internal $t_{WRT}$ and $t_{EQL}$ timing will also be the same, even though their external counterparts, $t_{WR}$ and $t_{RP}$, are different. Timer lockout circuit 140 is illustrated in FIG. 3 and described in more detail infra.

Figure 2:
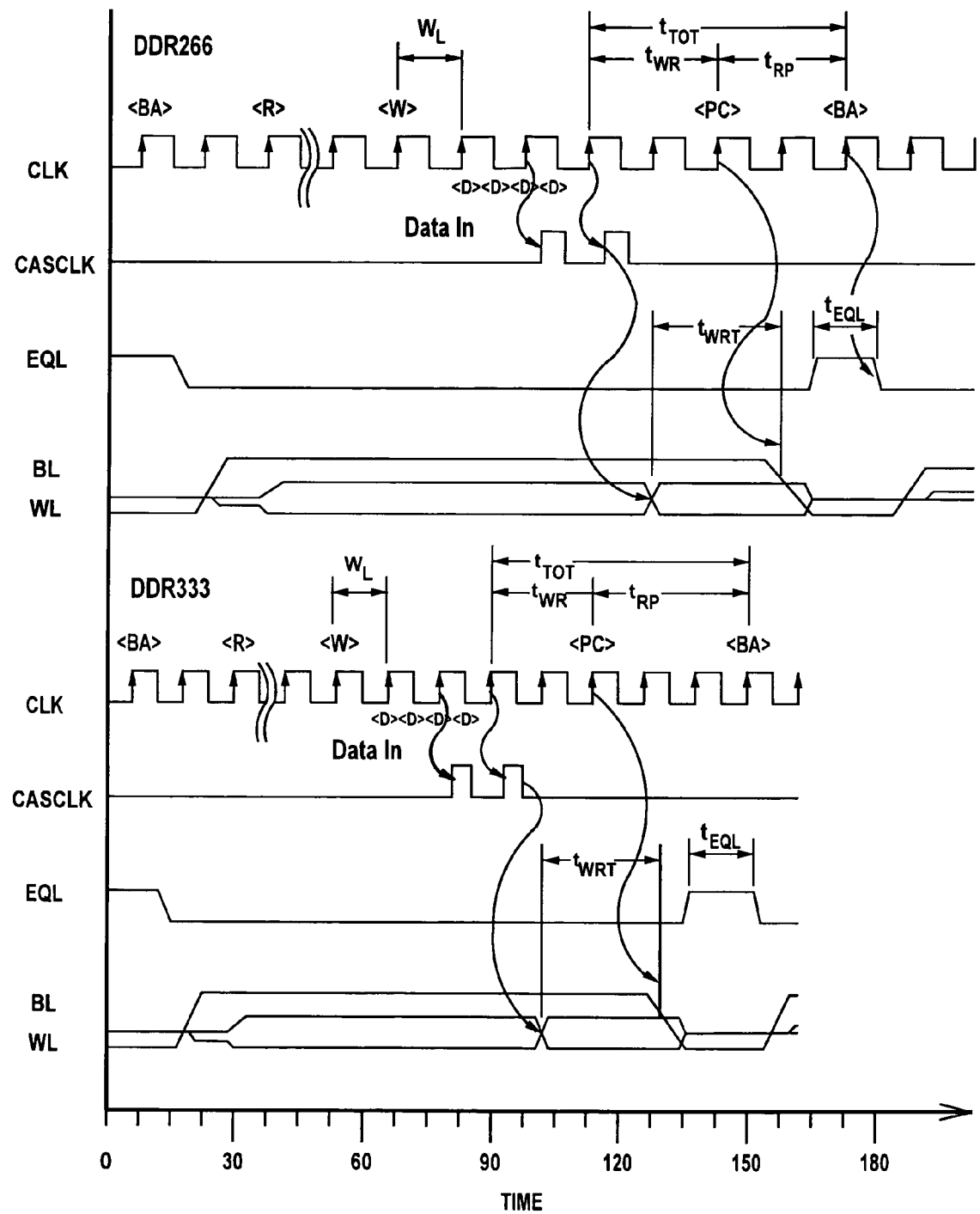
FIG. 2 is a timing diagram of the SDRAM circuit of FIG. 1.

FIG. 2 is a timing diagram of SDRAM 100 of FIG. 1. In FIG. 2, two sets of timings are illustrated. The first set of timings is for the DDR226 specification and the second set is for the DDR333 specification. In both sets of timing diagrams after a <W> command, <D> starts to be written onto bitlines one clock cycle later. This is the write latency ($W_L$). Note that a single four-bit data burst is shown as an example only. The number of data bits in the burst (burst length), as well as the number of consecutive bursts may be greater or less than that shown. In the example of FIG. 2, all data is written in groups of two data bits so that one CASCLK pulse is generated every time two bits of data are to be written. Thus, the four bit data burst in FIG. 2 results in two CASCLK pulses. The leading edge of a CASCLK pulse starts the process of writing data. Each time a CASCLK pulse occurs, timer lockout circuit 140 (see FIG. 1 or FIG. 3) will reset and start timing from zero. In the example of FIG. 2, there are two instances of CASCLK. The first instance (or assertion) starts the timer, and the second instance (or re-assertion) resets the timer to zero (i.e. timer lockout circuit 140 of FIG. 1 did not time out). This is important because a write data burst can be interrupted, making it unclear exactly which <D> is the last, and therefore on which CLK edge the $t_{WR}$ timing should begin.

In the DDR 226 specification, the CLK period is 7.5 ns, $t_{WR}$ and $t_{RP}$ are both 2 CLK periods (15 ns) in duration, and $t_{TOT}$ is 4 CLK periods (30 ns) in duration. In the DDR 333 specification the CLK period is 6.0 ns, $t_{WR}$ is 2 CLK periods (12 ns) in duration, $t_{RP}$ is 3 CLK periods (18 ns) in duration, and $t_{TOT}$ is 5 CLK periods (30 ns) in duration. Note however, that the internal timings, $t_{WRT}$ and $t_{EQL}$, are the same for both cases. This is accomplished by timer lockout circuit 140. (see FIG. 3) delaying the end of $t_{WRT}$ relative to <PC> by 3 ns.

Figure 3:
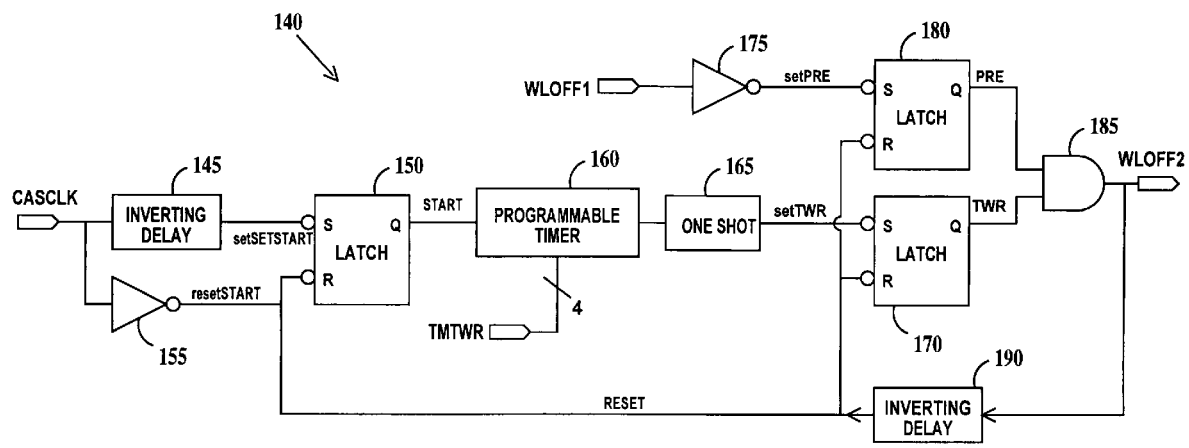
FIG. 3 is a schematic circuit diagram of a timer lockout circuit according to the present invention.

FIG. 3 is a schematic circuit diagram of timer lockout circuit 140 according to the present invention. In FIG. 3, timer lockout circuit includes a first inverting delay 145, a first latch 150, a first inverter 155, a programmable timer 160, a one shot pulse generator 165, a second latch 170, a second inverter 175, a third latch 180, an AND gate 185 and a second inverting delay 190.

First inverting delay 145 and first inverter 155 receive CASCLK and first inverting delay 145 generates a setSTART signal that is coupled to the set input of first latch 150. First inverter 155 generates a resetSTART signal that is coupled to the reset input of first latch 150. First latch 150 generates a START signal that is coupled to one-shot pulse generator 165 through programmable time 160 which delays the START signal by an amount determined by the value of TMTWR signal. In the present example, TMTWR is a four-bit word used to blow (program) fuses or antifuses that set the delay through programmable timer 160. The length of delay through programmable timer 160 is the difference in time between $t_{WR}$ of the DDR 226 specification and the DDR 333 $t_{WR}$ specification, in the present example 3 ns (adjusted for signal delay through first inverting delay 145, first latch 150, and one shot pulse generator 165). Programmable timer 160 will reset to zero and restart timing every time a start signal is received even if timing has previously started and was not completed. One shot pulse generator 165 generates a setTWR signal that is coupled to the set input of second latch 170. WLOFF1 is coupled to the input of second inverter 175. Second inverter 175 generates a setPRE signal coupled to the set input of third latch 180. The output of second latch 170 is a TWR signal and the output of third latch 180 is a PRE signal, which are ANDed together by AND gate 185 to produce WLOFF2. WLOFF2 is coupled to an input of inverting delay 190. The output of inverting delay 190 (a RESET signal) is coupled to the reset inputs of first, second and third latches 150, 170 and 180.

In operation, when CASCLK goes high, resetSTART goes low, resetting first latch 150 and START goes low. After a programmable delay by programmable timer 160, one shot generator 165 pulses setTWR low, second latch 170 sets so TWR goes high. If both PRE and TWR are high, then WLOFF2 is high.

From a SRDAM point of view, since WLOFF1 is derived from the <PC> command when the <PC> command goes high, third latch 180 sets and the PRE signal is presented to AND gate 185. After a data write event (CASCLK pulses) programmable timer 160 times out, setting second latch 170 and TWR is presented to AND gate 185. Thus, when both conditions, WLOFF1 is high and programmable timer 160 times-out, WLOFF2 goes high.

IF WLOFF1 goes high after programmable timer 160 times-out (an therefore a sufficient amount of internal write time $t_{WRT}$ has elapsed), then WLOFF2 looks substantially like WLOFF1. However, if the timer has not timed-out (and therefore insufficient write time $t_{WRT}$ has elapsed), then WLOFF2 is a delayed version of WLOFF1 that will allow additional $t_{WRT}$ time. First inverting delay 145 ensures that enough time is allowed to reset programmable timer 160 before the programmable timer must be re-started. Timer lockout circuit 140 essentially times the rise of CASCLK to the end of $t_{WRT}$ and presents that timing as WLOFF2.

Figure 4:
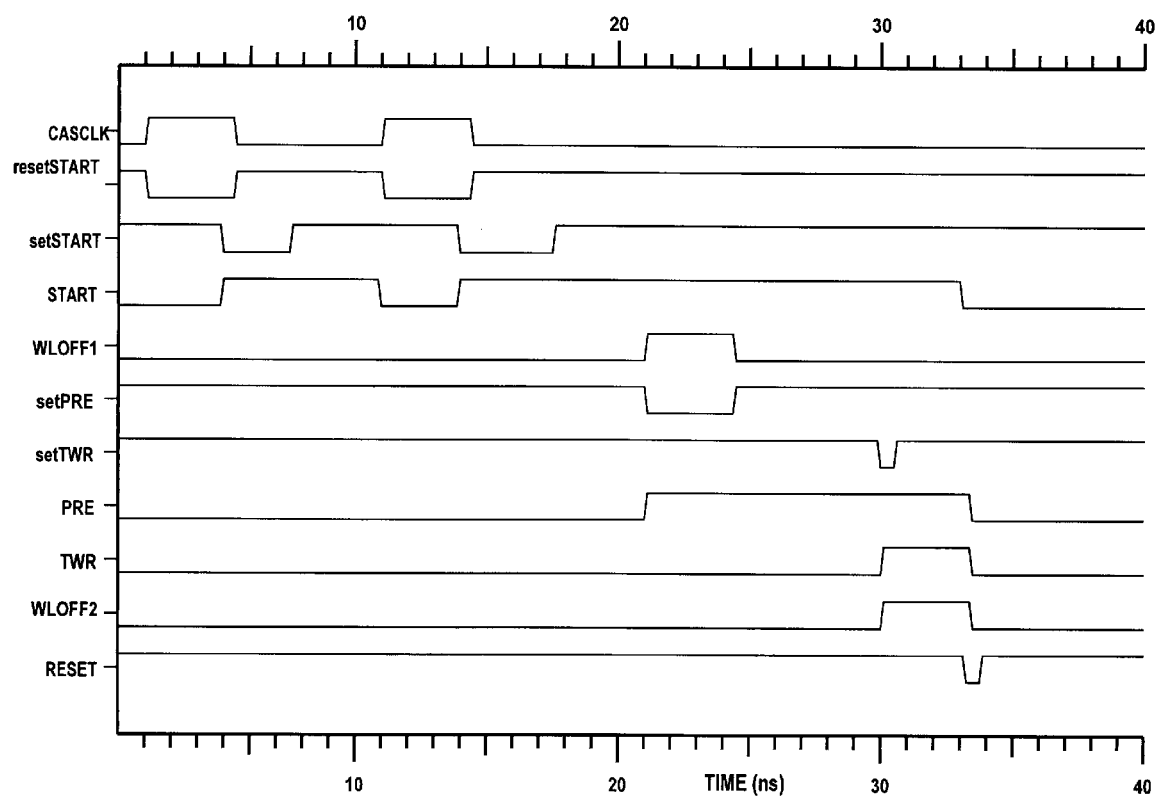
FIG. 4 is a timing diagram of the timer lockout circuit of FIG. 3.

FIG. 4 is a timing diagram of timer lockout circuit 140 of FIG. 3 summarizing the operation of the lockout circuit.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A timer lockout circuit comprising:
   a first delay circuit for receiving and delaying a first timing signal;
   a first circuit for receiving said first timing signal from said first delay circuit and for latching said first timing signal;
   a programmable timing circuit for receiving said first timing signal from said first circuit and for delaying said first timing signal by a programmable time interval;
   a one-shot generator for receiving said first timing signal from said programmable timing circuit and for generating a set signal;
   a second circuit for receiving said set signal from said one-shot generator and for latching said set signal;
   a third circuit for receiving a second timing signal and for latching said second timing signal;
   a combinational logic circuit for receiving said set signal from said second circuit and for receiving said second timing signal from said third circuit and for generating a third timing signal; and
   a second delay circuit for receiving and delaying said third timing signal and for simultaneously resetting said first circuit, said second circuit and said third circuit after delaying said third timing signal.

2. The circuit of claim 1, wherein said programmable timing circuit resets to zero elapsed time upon de-assertion of said first timing signal if said programmable interval has not been reached prior to said de-assertion of said first timing signal 3. The circuit of claim 1, wherein said programmable time interval is determined by a digital signal based on the state of fuses or antifuses electrically coupled to said programmable timing circuit.

4. The circuit of claim 1, further including an inverter for receiving said first timing signal, inverting said first timing signal and for applying said inverted first timing signal to a reset input of said first circuit.

5. The circuit of claim 1, wherein said second delay circuit applies said third timing signal to reset inputs of said first circuit, said second circuit and said third circuit.

6. The circuit of claim 1, wherein said combinational logic circuit is an AND gate.

7. A timer lockout circuit comprising:
   first means for receiving a first timing signal from a first delay circuit and for latching said first timing signal;
   second means for receiving said first timing signal from said first means and for delaying said first timing signal by a programmable time interval;
   third means for receiving said first timing signal from said second means and for generating a set signal;
   fourth means for receiving said set signal from said third means and for latching said set signal;
   fifth means for receiving a second timing signal and for latching said second timing signal;
   sixth means for receiving said set signal from said fourth means and for receiving said second timing signal from said fifth means and for generating a third timing signal; and
   seventh means for simultaneously resetting said first means, said fourth means and said fifth means.

8. The circuit of claim 7, further including an eighth means for receiving said first timing signal, inverting said first timing signal and for applying said inverted timing signal to a reset input of said first means.

9. The circuit of claim 7, further including a ninth means for delaying said third timing signal prior to applying said third timing signal to reset inputs of said first means, fourth means and fifth means.

10. The circuit of claim 7, further including a fuse or antifuse circuit for generating a digital signal to set said programmable time interval.

11. A method for delaying a timing signal, comprising:
   providing a delay circuit for receiving and delaying a first timing signal;
   providing a first circuit for receiving said first timing signal from said first delay circuit and for latching said first timing signal;
   providing a programmable timing circuit for receiving said first timing signal from said first circuit and for delaying said first timing signal by a programmable time interval;
   providing a one-shot generator for receiving said first timing signal from said programmable timing circuit and for generating a set signal;
   providing a second circuit for receiving said set signal from said one-shot generator and for latching said set signal;
   providing a third circuit for receiving a second timing signal and for latching said second timing signal;
   providing a combinational logic circuit for receiving said set signal from said second circuit and for receiving said second timing signal from said third circuit and for generating a third timing signal; and
   providing a second delay circuit for receiving and delaying said third timing signal and for simultaneously resetting said first circuit, said second circuit and said third circuit after delaying said third timing signal.

12. The method of claim 11, further including:
   resetting said programmable timing circuit to zero elapsed time upon de-assertion of said first timing signal if said programmable interval has not been reached prior to said de-assertion of said first timing signal 13. The method of claim 11, further including:
   setting said programmable time interval based on a digital signal received by said programmable timing circuit, said digital signal based on the state of fuses or antifuses electrically coupled to said programmable timing circuit.

14. The method of claim 11, further including:
providing an inverter for receiving said first timing signal, inverting said first timing signal and for applying said inverted timing signal to a reset input of said first circuit.

15. The method of claim 11, further including:
applying said third timing signal to reset inputs of said first circuit, said second circuit and said third circuit.

16. The method of claim 11, wherein said combinational logic circuit is an AND gate.

17. The method of claim 11, further including:
providing an SDRAM array, wherein said first timing signal is a column address strobe clock, said second timing signal is a wordline off signal and said third timing signal is a delayed wordline off signal; and
applying said delayed wordline off signal to wordlines of said SDRAM array.

18. The method of claim 17, further including:
setting said programmable time interval to enable said SDRAM array to meet either (i) a first specification of a clock speed of 7.5 ns, a writer recovery time of 15 ns and a precharge time of 15 ns, or (ii) second specification of a clock speed of 6.0 ns, a writer recovery time of 12 ns and a precharge time of 18 ns.

* * * * *